(12) United States Patent
Krieger et al.

(10) Patent No.: US 7,254,053 B2
(45) Date of Patent: Aug. 7, 2007

(54) ACTIVE PROGRAMMING AND OPERATION OF A MEMORY DEVICE

(75) Inventors: Juri Heinrich Krieger, Brookline, MA (US); Nikolay Fedorovich Yudanov, Brookline, MA (US)

(73) Assignee: Advanced Micro Devices, Inc., Austin, TX (US)

( * ) Notice: Subject to any disclaimer, the term of this patent is extended or adjusted under 35 U.S.C. 154(b) by 71 days.

(21) Appl. No.: 10/776,870

(22) Filed: Feb. 11, 2004

(65) Prior Publication Data

US 2004/0160801 A1 Aug. 19, 2004

Related U.S. Application Data

(63) Continuation-in-part of application No. PCT/RU01/00334, filed on Aug. 13, 2001.

(51) Int. Cl.
G11C 13/00 (2006.01)
G11C 11/00 (2006.01)
(52) U.S. Cl. .................... 365/151; 365/153; 365/105
(58) Field of Classification Search ................ 365/158, 365/171, 173, 106, 112, 113, 115, 151, 153; 257/40, 295, 315
See application file for complete search history.

(56) References Cited

U.S. PATENT DOCUMENTS

| | | | |
|---|---|---|---|
| 4,652,894 A | 3/1987 | Potember et al. | |
| 4,663,270 A | 5/1987 | Potember et al. | |
| 5,579,199 A | 11/1996 | Kawamura et al. | |
| 5,589,692 A | 12/1996 | Reed | |
| 6,055,180 A | 4/2000 | Gudesen et al. | |
| 6,069,820 A * | 5/2000 | Inomata et al. | 365/171 |
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,314,019 B1 | 11/2001 | Kuekes et al. | |
| 6,320,200 B1 | 11/2001 | Reed et al. | |
| 6,324,091 B1 | 11/2001 | Gryko et al. | |
| 6,348,700 B1 | 2/2002 | Ellenbogen et al. | |
| 6,381,169 B1 * | 4/2002 | Bocian et al. | 365/151 |

(Continued)

FOREIGN PATENT DOCUMENTS

RU 99101838 12/2000

(Continued)

OTHER PUBLICATIONS

International Search Report, PCT/RU01/00334, Feb. 21, 2002.

*Primary Examiner*—Trong Phan
(74) *Attorney, Agent, or Firm*—Amin, Turocy & Calvin, LLP

(57) ABSTRACT

Systems and methodologies for programming a memory cell having a functional or selective conductive layer are provided. The functional zone can include active, and/or passive and/or barrier layers. The system includes a controller that can actively trace conditions associated with such programming. In one aspect of the present invention, by providing an external stimulus, an associated electrical or optical property associated with the memory cell is affected. Such property is then compared to a predetermined value to set/verify a programming state for the memory cell. The external stimulus can then be removed upon completion of the programming, or reduced to a verifying state to read information. The memory cell can include alternating layers of active, passive, diode, and barrier layers positioned between at least two electrodes.

19 Claims, 17 Drawing Sheets

U.S. PATENT DOCUMENTS

| | | | |
|---|---|---|---|
| 6,424,565 B2 * | 7/2002 | Brug et al. | 365/171 |
| 6,627,944 B2 * | 9/2003 | Mandell et al. | 257/315 |
| 6,781,868 B2 * | 8/2004 | Bulovic et al. | 365/151 |
| 6,839,275 B2 * | 1/2005 | Van Brocklin et al. | 365/173 |
| 6,870,183 B2 * | 3/2005 | Tripsas et al. | 257/40 |
| 6,873,543 B2 * | 3/2005 | Smith et al. | 365/158 |
| 6,885,573 B2 * | 4/2005 | Sharma et al. | 365/158 |
| 6,900,488 B1 * | 5/2005 | Lopatin et al. | 257/295 |
| 6,950,331 B2 * | 9/2005 | Yang et al. | 365/151 |

FOREIGN PATENT DOCUMENTS

| | | |
|---|---|---|
| WO | WO 03/017282 A1 | 2/2003 |

* cited by examiner

ACTIVE PROGRAMMING AND OPERATION OF A MEMORY DEVICE

CROSS REFERENCE TO RELATED APPLICATIONS

This application is a Continuation-in-Part of PCT application PCT/RU01/00334 filed Aug. 13, 2001.

FIELD OF THE INVENTION

The present invention relates generally to memory devices and, in particular, to programming a memory device having a functional layer via a controlled operation.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase speed and storage retrieval for memory devices (e.g., increase write/read speed). At the same time, to reach high storage densities, manufacturers typically focus on scaling down semiconductor device dimensions (e.g., at sub-micron levels). Nonetheless, as the size of inorganic solid state devices decreases and integration increases, sensitivity to alignment tolerances can also increase making fabrication markedly more difficult. Moreover, formation of features at small minimum sizes does not imply that the minimum size can be used for fabrication of working circuits. Furthermore, such shrinkage for inorganic non-volatile memory cells, can be particularly difficult to do while maintaining low costs. Accordingly, silicon-based devices are approaching their fundamental physical size limits, and further device shrinking and density increasing may be limited for such memory cells.

Therefore, there is a need to overcome the aforementioned deficiencies associated with conventional memory cells and their programming.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods for programming a memory cell(s) with functional zone(s)/layer(s), or selective conductive layers, by employing a controlled operation. The functional zone can include active, and/or passive and/or barrier layers, as described in more detail infra. Such programming can typically provide for stability, viability and fast switching of a memory cell's operation at a multi-bit level. According to one aspect of the present invention, an "active" mode of programming is employed to program a memory cell with a functional zone—(in contrast to a "passive" method that can employ a load resistance during an "ON" state to limit a flowing current, with the memory cell exhibiting an impedance equal to the value of the load resistance.) Initially, the memory cell to be programmed receives an external stimulus. Such an external stimulus can be supplied via a control component, and can influence an electrical and/or optical property(ies) associated with the functional zone of the memory cell to be programmed. The control component can further control the external stimulus, and thereby regulate and/or trace the influenced property of the memory cell. The value of such property thus affected is then compared to a reference threshold, which is set for that particular property—other electrical/optical features that are dependent on the affected property can also be compared to respective predetermined values to effectuate a corresponding programming state. Based on such comparison, the programming can then be verified, and the external stimulus removed upon completion of the programming state.

For example, the reference threshold can designate a lower limit associated with a particular programming state for the memory cell. If the value of the affected property exceeds the reference threshold, then the cell is properly programmed for that particular state. The reference threshold can also set an upper limit, or include a range associated with that programming state.

In one exemplary aspect of active mode programming according to the present invention, size of the current through the memory cell in an "ON" state is set by a control system that actively traces conditions for switching of the memory cell. The control system can further include an artificial intelligence component that can regulate, and/or monitor, state of the electric current/voltage applied to the memory cell during its programming and/or information recording/reading. Moreover, the artificial intelligence component can send verifying signal to the memory cell at various stages to verify its programmable state. Such signal can be in the form of an electric current and/or voltage. It is to be appreciated that such verification arrangement (e.g. for a write or erase) during, for example, switching from an "OFF" state to an "ON" state can depend on the particular structural design of the memory cell with the functional zone to be programmed, e.g. number of top electrodes.

In an exemplary methodology according to the present invention, the control system can be a generator of a controllable voltage pulse coupled to a ballast resistor that modifies an incoming current/voltage to maintain programming conditions. The generator initially generates a voltage exceeding a threshold value associated with a particular programming state for the memory cell. Accordingly, an ensuing electric current pulse passing through the memory cell can then reach a predetermined value required for the writing mode, at which time the writing operation for the memory cell is considered complete. Subsequently, the generator switches to a reading mode and generates a reading voltage that is substantially lower than the threshold voltage value required for writing. Based on a value of the electric current flowing through the ballast resistor, the impedance of the memory cell can be estimated. Such resistance values can then be corresponded to specific bit information to facilitate a read thereof. In a related aspect of the present invention, erasing of the information occurs when the generator sends a negative voltage pulse with the controlled erasing current value reaching a preset value. The erase operation is considered complete when the controlled values of current and/or resistance values reach the preset level, whereupon the electric voltage is being turned off.

The memory cell with a functioning zone to be such programmed can comprise of several electrodes stacked on top of each other, with alternating passive/active/barrier layers that constitute the functioning zone. Accordingly, the memory cell programming can be performed by applying voltages and —or controlling resistance values among selected electrodes of the memory cell.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

DETAILED DESCRIPTION OF THE INVENTION

Figure 1:
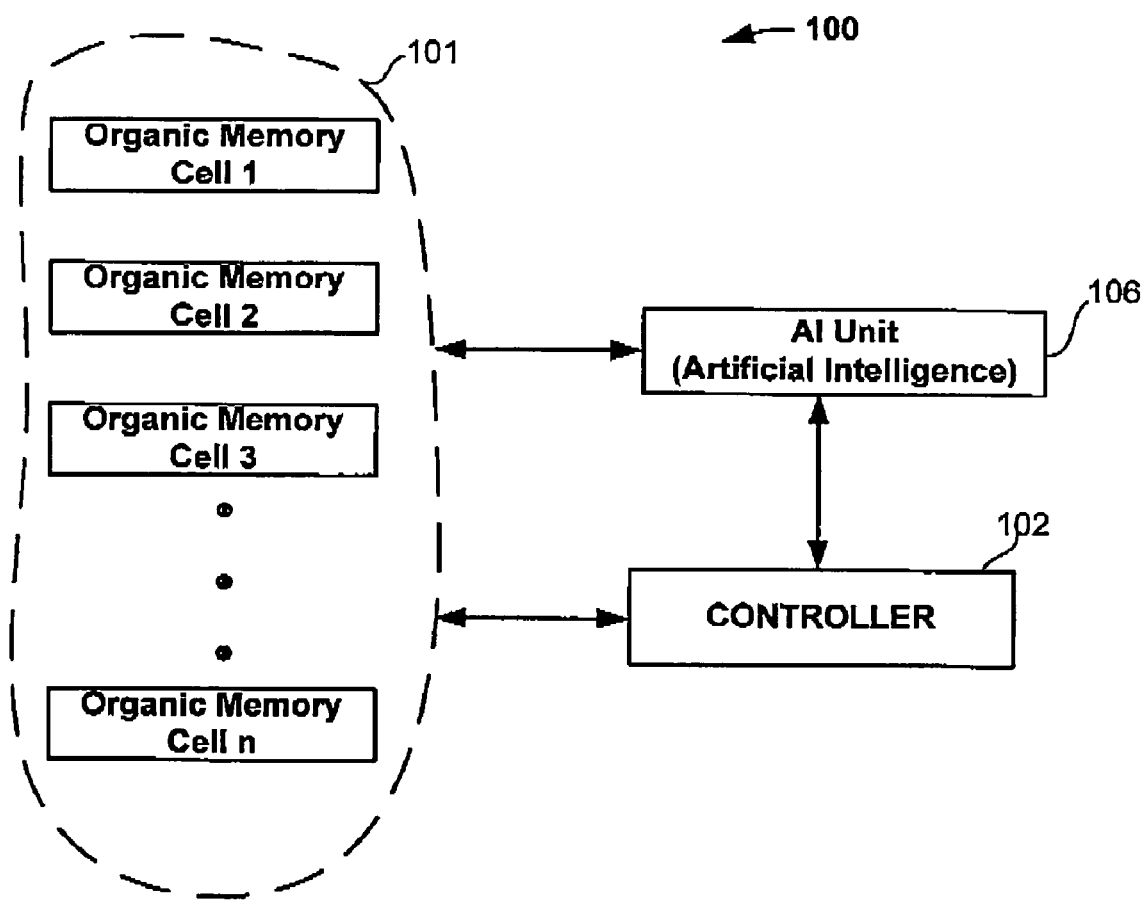
FIG. 1 is a block diagram of a system that controls a programming of a memory cell with functioning zones, in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

Referring initially to FIG. 1, a schematic block diagram illustrating a system 100 that actively programs a plurality of n memory cells 101, (n being an integer) each with a functional layer, according to one aspect of the present invention. The system includes a controller component 102 that can write/read/erase any of the memory cells operatively connected thereto by employing a controlled operation. Typically, each memory cell of the group can accept and maintain a plurality of states, in contrast to a conventional memory device that is limited to two states (e.g., off or on). Accordingly, each memory cell can employ varying degrees of conductivity to identify additional states. For example, the memory cells can have a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information (e.g., 4 states providing 2 bits of information, 8 states providing 3 bits of information and the like.)

Switching a memory cell of the group 101 to a particular state is referred to as programming or writing. For example, programming can be accomplished by applying a particular voltage (e.g., 9 volts, 2 volts, 1 volts, . . . ) across selected layers of the functioning zone of the memory cell, as described in detail infra. Such particular voltage, also referred to as a threshold voltage, can vary according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the particular memory cell to be programmed, the thickness of the various layers, and the like.

As such, the presence of an external stimuli such as an applied, voltage or electric field that exceeds a threshold value (e.g. "on" state) permits the writing, reading, or erasing information into/from the memory cells 101; whereas the absence of the external stimuli that exceeds a threshold value ("off" state) prevents a write or erase of information into/from the memory cells 101.

"To read information from the memory cells 101, a voltage or electric field (e.g., 2 volts, 1 volts, 0.5 volts) can be applied via the controller 102. Subsequently, an impedance measurement can be performed which, therein determines which operating state one or more of the memory cells are in (e.g., high impedance, very low impedance, low impedance, medium impedance, and the like). As stated supra, the impedance relates to, for example, "on" (e.g., 1) or "off" (e.g., 0) for a dual state device, or to "00", "01", "10", or "11" for a quad state device. It is appreciated that other numbers of states can provide other binary interpretations. To erase information written into the memory cells 101, a negative voltage or a polarity opposite the polarity of the writing signal that exceeds a threshold value can be applied.

The system 100 in connection with such active programming can employ various artificial intelligence based schemes 106 for carrying out various aspects thereof. For example, a process for learning explicitly or implicitly when a particular memory device should be provided with a signal that initiates a write, read, or erase, can be facilitated via an automatic classification system and process. In addition, tracing of an affected feature associated (e.g. current and/or voltage) with a particular memory cell can be accomplished via such artificial intelligence component 106. Classification can employ a probabilistic and/or statistical-based analysis (e.g., factoring into the analysis utilities and costs) to prognose or infer an action on a particular memory cell that is desired to be automatically performed. For example, a support vector machine (SVM) classifier can be employed. Other classification approaches include Bayesian networks, decision trees, and probabilistic classification models providing different patterns of independence can be employed. Classification as used herein also is inclusive of statistical regression that is utilized to develop models of priority. As will be readily appreciated from the subject specification, the subject invention can employ classifiers that are explicitly trained (e.g., via a generic training data) as well as implicitly trained (e.g., via receiving extrinsic information) so that the classifier is used to automatically determine according to a predetermined criteria what action to perform, or which answer to return to a question. For example, with respect to SVM's that are well understood, SVM's are configured via a learning or training phase within a classifier constructor and feature selection module. A classifier is a function that maps an input attribute vector, $x=(x1, x2, x3, x4, xn)$, to a confidence that the input belongs to a class—that is, $f(x)$ =confidence (class). As used in this application, the terms "component" and "system" are also intended to refer to a computer-related entity, either hardware, a combination of hardware and software, software, or software in execution. For example, a component can also be, but is not so limited, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. It is to be appreciated that filters, minifilters, filter managers, classifiers, models, order groups and other various items are components.

The memory set 101 can be an array of memory cells that is generally formed on a silicon based wafer, and includes a plurality of rows, referred to as bitlines, and a plurality of columns, referred to as wordlines. Such bit line and wordlines can be connected to the top and bottom metal layers of an individual memory cell's electrode. The intersection of a bitline and a wordline constitutes the address of a particular memory cell, wherein data can be stored in the memory cells (e.g., as a 00 or a 01, 10, 11 for a two bit memory cell operation) by choosing and sending signals via the artificial intelligence component 106 to the appropriate columns and rows in the array. (e.g., via a column address strobe (CAS) and a row address strobe (RAS), respectively). As will be described infra, to write to a memory cell, a signal (e.g. current and/or voltage) can be sent to the appropriate column and row address to overcome a threshold voltage and/or current value associated with that particular memory cell location. Similarly, to erase an memory cell of such array, a reverse voltage can be directed to the desired memory cell address. The present invention has application to any number of memory cells and is not to be limited to any particular configuration, arrangement and/or number of memory cells.

Figure 2:
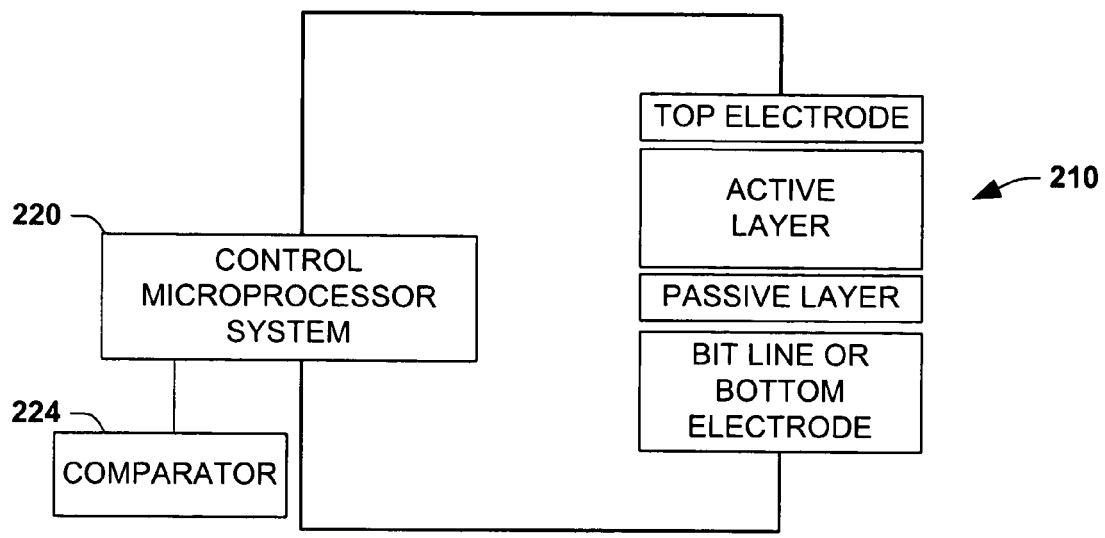
FIG. 2 illustrates a schematic programming system for a memory cell, according to one aspect of the present invention.

FIG. 2 illustrates a schematic programming system for a memory cell with a functional zone wherein the controller comprises a microprocessor 220. The microprocessor 220 can be part of a suitably programmed general purpose computer of a network and can also be implemented by employing a plurality of separated dedicated programmable integrated or other logic devices. Other information display devices (e.g. monitors, displays and the like), as well as user input devices can be operatively connected to the input/output of such processor. The processor 220 can actively trace and control a program state of the memory cell 210. For example, the microprocessor system 220 can provide a programming signal, e.g. a voltage applied to the memory element 210, and detect an ensuing electric current that flows through it. When such current is detected to be at a predetermined value that represents a particular resistance of the memory element 210, the voltage can be removed, and programming stopped. Such can be accomplished by comparing the current via a comparator 224 to reference values. Accordingly, the memory cell 210 can be programmed to a predetermined state. Likewise, by applying a reverse signal, e.g. reverse voltage, information of that state can be erased from such memory cell.

Figure 3:
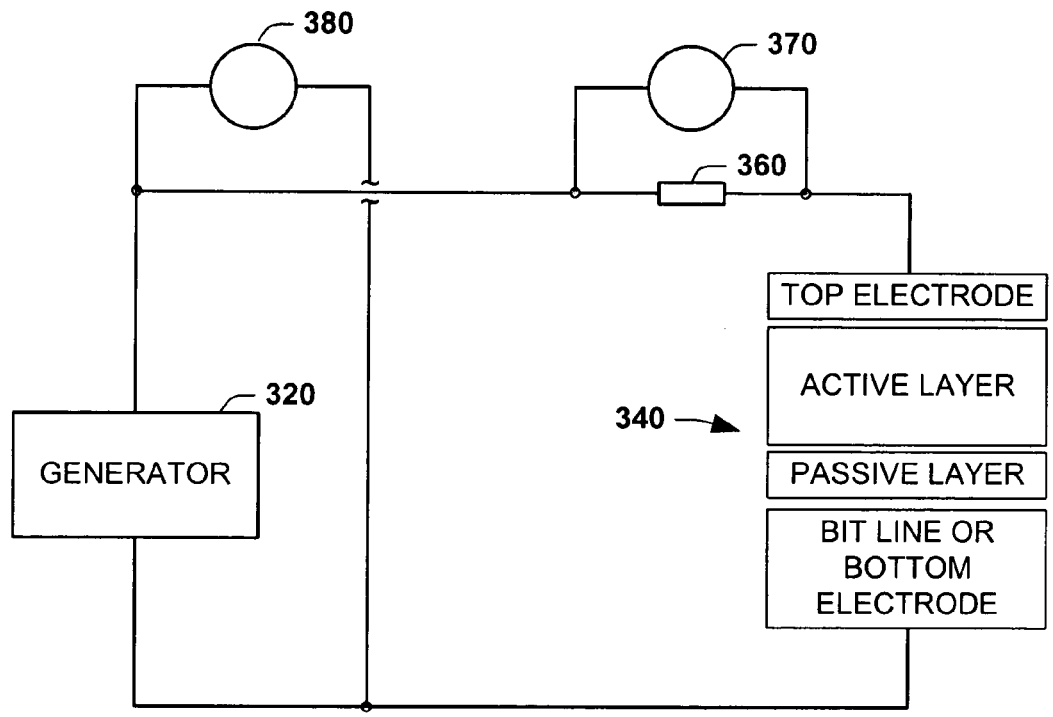
FIG. 3 illustrates a particular programming circuit for a memory cell having two electrodes.

Referring now to FIG. 3 a circuit that programs a memory cell having a functional zone according to one aspect of the present invention is illustrated. The control system for such circuit includes a generator 320 that can provide a controllable electrical current level (e.g. a programmable current) during information writing and/or recording of the memory cell 340. The memory cell 340 includes two electrodes that sandwich various layers e.g. a selective conductive layer (functional layer) comprising an active layer (e.g. organic layer) and a passive layer, as will be explained infra. It is to be appreciated that the present invention is not so limited and other layers such as functioning zone layers; barrier layers; active/passive layers, and the like can also be employed with other aspects of the present invention.

A ballast resistor 360 is operatively connected to the memory cell 340, and has a resistance that increases rapidly with increases in current through the resistor 360, thereby tending to maintain an essentially constant current despite any variations in the line voltages. Registering devices 370 and 380 can monitor circuit conditions during various programming stages of the memory cell 340. For example, the value of the current flowing through the memory cell can be obtained by measuring voltage on the ballast resistor 360, and such registering device can include voltmeters, oscillographs, recorders and other devices employed for monitoring circuit conditions at any moment.

Figure 4:
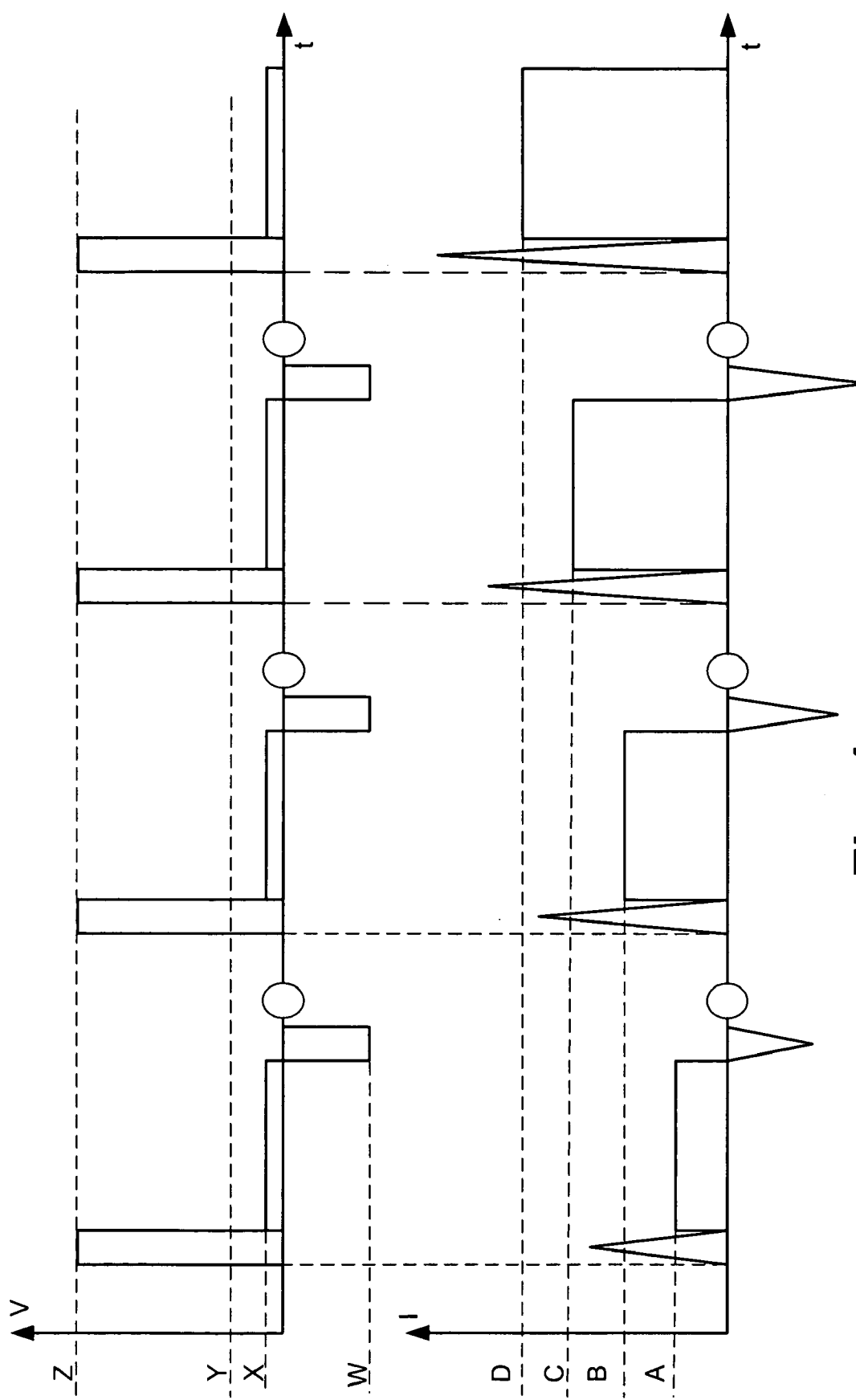
FIG. 4 illustrates graphs associated with voltage-time and current-time for various programming states of a memory cell according to one aspect of the present invention.

According to one particular methodology of the present invention, the generator 320 forms an initial voltage pulse that exceeds a threshold value required for programming a memory cell. For example, FIG. 4 illustrates associated voltage-time and current-time graphs of such a methodology for writing a two bit memory cell operation. Voltage levels "Z" and "Y" depict an initial voltage pulse and a threshold voltage respectively. The values of the current flowing through the memory cell 340 can then be obtained by measuring voltage on the ballast resistor 360. As such, current flowing through the memory cell can be controlled such that the various electric current pulse states correspond to respective bits of information, written in to the memory cell. For example and as depicted in FIG. 4; electric current level "A" can designate a value "00", electric current level "B" can designate a value "01", electric current level "C" can designate a value "10", and electric current level "D" can designate the value "11", all which are programmable into the memory cell 340.

Next, and after the electric current pulse reaches the desired programmed state, the write programming is complete, and the programming voltage switched off. Similarly, to read bits of information from the memory cell 340, a reading voltage "X" that is lower than the threshold voltage value "Y" is generated via the generator 320. Based on the amount of current flowing through the ballast resistor 360 of FIG. 3, the resistance of the memory cell 340 can then be estimated, and an electric current flowing through it obtained. Such electric current can then correspond to a reference electric current, to verify a programmed state of the memory cell. Likewise, to erase information, the generator 320 creates a negative voltage pulse W, which can create a current, controlled to reach an erase threshold value flowing through the memory cell. It is to be appreciated that other properties besides voltage, current, or impedance can be employed to program a memory cell having a functioning zone. For example, the controlled value can be an intensity of light (optical programming when light sensor/emitter layers are employed), or amount of time that the memory cell is subject to an external stimulus and/or signal. Such can also depend upon the structure of a particular memory cell, and material employed in its fabrication, as for the particular memory structure illustrated by FIG. 3, it may be necessary to return the cell to its initial state and erase recorded information before a further write operation can be performed.

Figure 5:
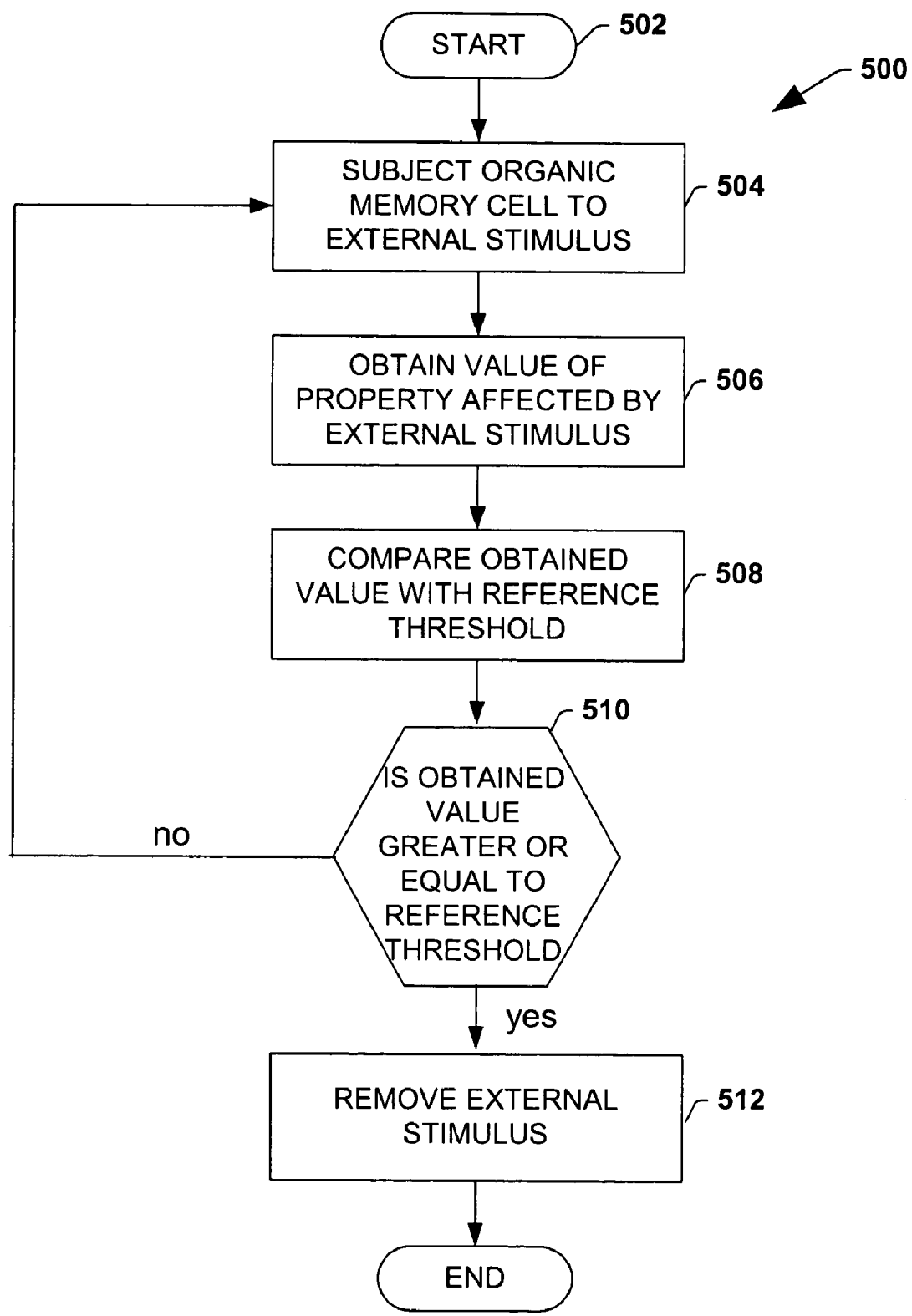
FIG. 5 illustrates an exemplary methodology for programming a memory cell in accordance with an aspect of the present invention.

Turning to FIG. 5, a flow diagram illustrates a methodology 500 for programming a memory cell according to one or more aspects of the present invention. The methodology begins at 502 where general initializations are performed. Such initializations can include, but are not limited to, establishing pointers, allocating memory, setting variables, establishing communication channels and/or instantiating one or more objects. At 504, the memory cell to be programmed receives an external stimulus. Such an external stimulus can be supplied via a control component, and can change an electrical and/or optical property(ies) associated with the memory cell. The control component can further monitor/regulate the external stimulus, and thereby control the influenced property of the memory cell. At 506, the value of property thus affected can be obtained (e.g. calculated and/or measured). Subsequently at 508, the obtained value is compared (e.g. via a comparator of the control system) to a reference threshold determined for that particular property. Such reference threshold can set an upper limit associated with a particular programming state for the memory cell having a functional zone to be programmed. It is to be appreciated that other electrical/optical features that are dependent on the affected property can also be compared to respective predetermined values, and employed as reference criteria for verifying the program state.

Next, the process progresses to comparing step 510, if the value of the affected property exceeds or is equal to the reference threshold, then programming for such state is considered complete. The method then removes the external stimulus at 512, and ends at 514. Otherwise, the program returns to subjecting the memory cell to a new stimulus. It is to be appreciated that the reference threshold can set a lower limit associated with a particular programming state. Moreover, the threshold reference can also constitute a range, and the comparison step verifying whether the affected property of the memory cell falls within the range or not. While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. For example, the memory cell can be subject to a stimulus that facilitates reading bits of information, as opposed to writing or erasing. In addition, not all illustrated blocks, events or acts, may be required to implement a methodology in accordance with the present invention. Moreover, it will be appreciated that the exemplary method and other methods according to the invention may be implemented in association with programming the memory cell illustrated and described herein, as well as in association with other systems and apparatus not illustrated or described.

Figure 6A:
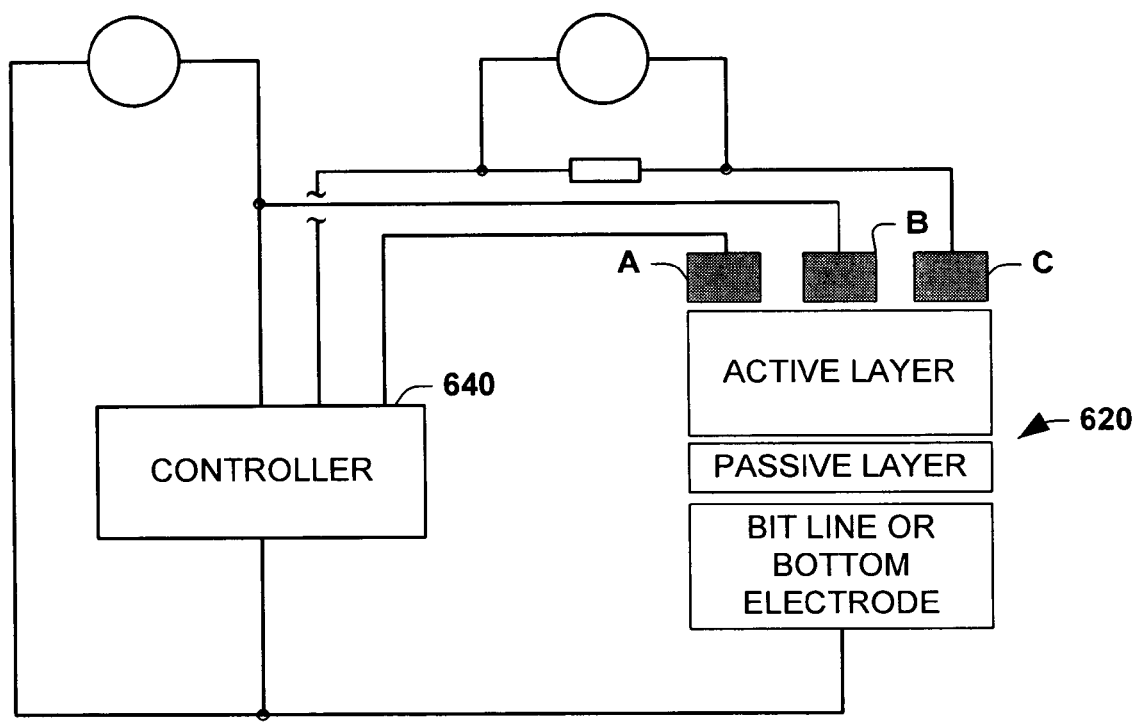
FIG. 6a illustrates a programming circuit according to a further aspect of the present invention for a memory cell with functional zones employing three upper electrodes.

FIG. 6a illustrates a circuit that programs a memory cell having a functioning layer according to a further aspect of the present invention. The memory cell 620 includes a top electrode comprising of three partial electrode components; A, B, C, which together with a bottom electrode, sandwich a selective conductive layer, as will be described infra. The circuit also includes a controller 640 that can provide a controllable electrical current, or voltage level (e.g. a programmable current or voltage) during information writing and/or recording of the memory cell 620, while at the same time an electric resistance between end electrode elements A, C is being controlled. As described supra writing of information can, for example, be considered complete when a controlled electrical resistance value associated with the memory cell reaches a predetermined or preset value. Thereafter, the applied voltage can be switched off. Similarly, information can be read by subjecting the memory cell to low voltage pulses to measure the electrical resistance between elements A, C. As illustrated, the structure for the electrodes of the memory cell enables two modes (zero, non-zero) for reading information when voltage is applied between the bottom electrode and the upper electrode element B. In addition, such structure facilitates a control accuracy of programming the memory cell, as the write and read circuits are isolated and decoupled. Thus, for example control of a resistance value at various points of the memory cell can generally be improved.

Figure 6B:
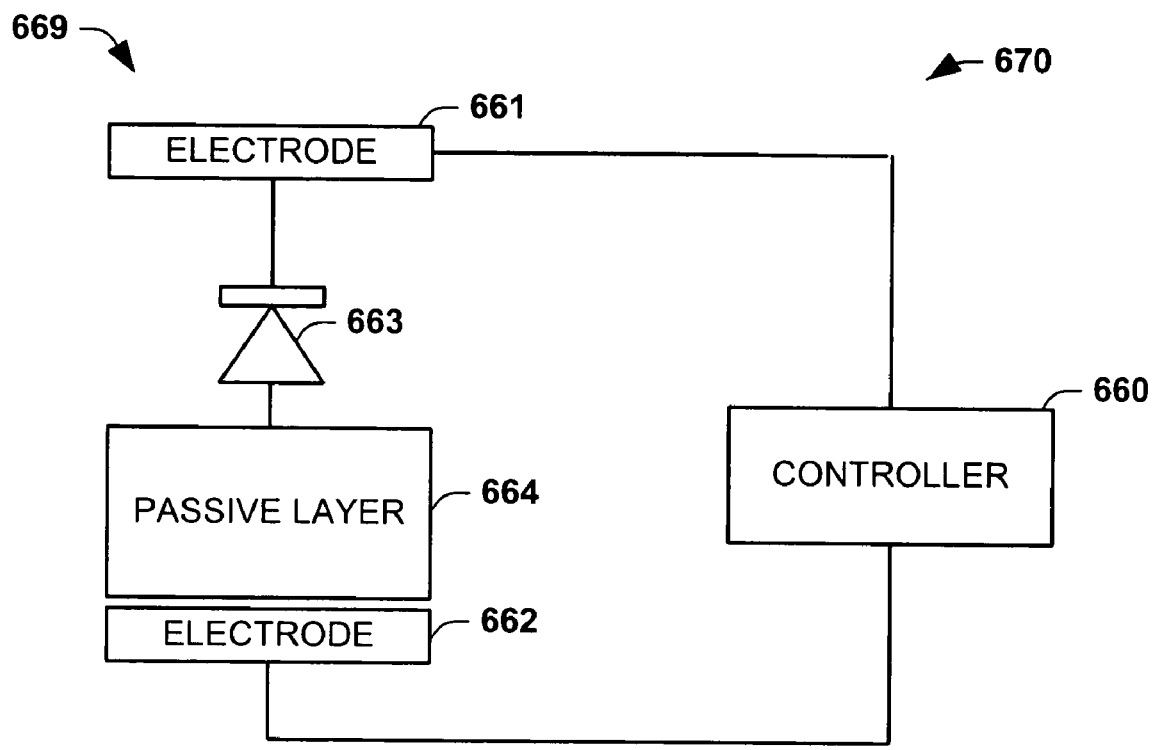
FIG. 6b illustrates a schematic block diagram of a diode operating as part of a memory cell for a data processing system in accordance with an aspect of the present invention.

FIG. 6b illustrates a schematic block diagram of data processing system 670 with a memory cell having a diode in accordance with an aspect of the present invention. Controller 660 which can include a logic component can program the memory cell 669 according to methodologies discussed supra. The diode 663 can be an optical diode positioned between electrodes 661 and 662 of a memory cell 669 having a passive layer 664. The diode itself can form a layer and comprise electrode layer(s) with organic and/or nom-organic material. Accordingly, the memory cell 669 can be programmed by a signal that applies a forward bias (or a reverse bias). For example, in case of a reverse bias programming, the controller 660 can apply a reverse bias voltage that exceeds the diode 663 breakdown voltage and create an electric field (or a current) between electrodes 661, 662. It is to be appreciated that that the diode 663 can also be separate of the memory cell structure 669.

Figure 7A:
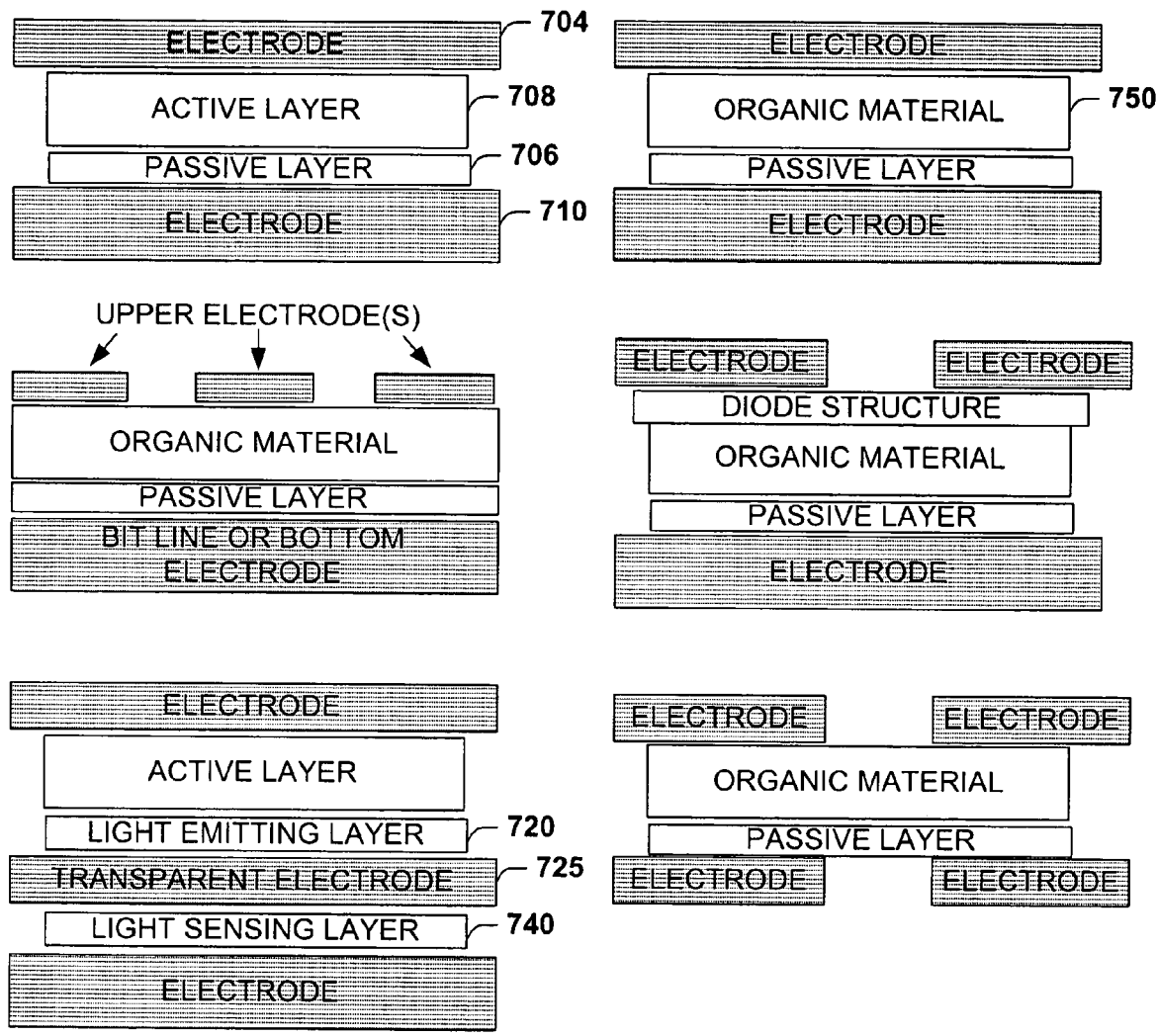
FIGS. 7a and 7b illustrate various structures of memory devices in accordance with an aspect of the present invention.
Figure 7B:
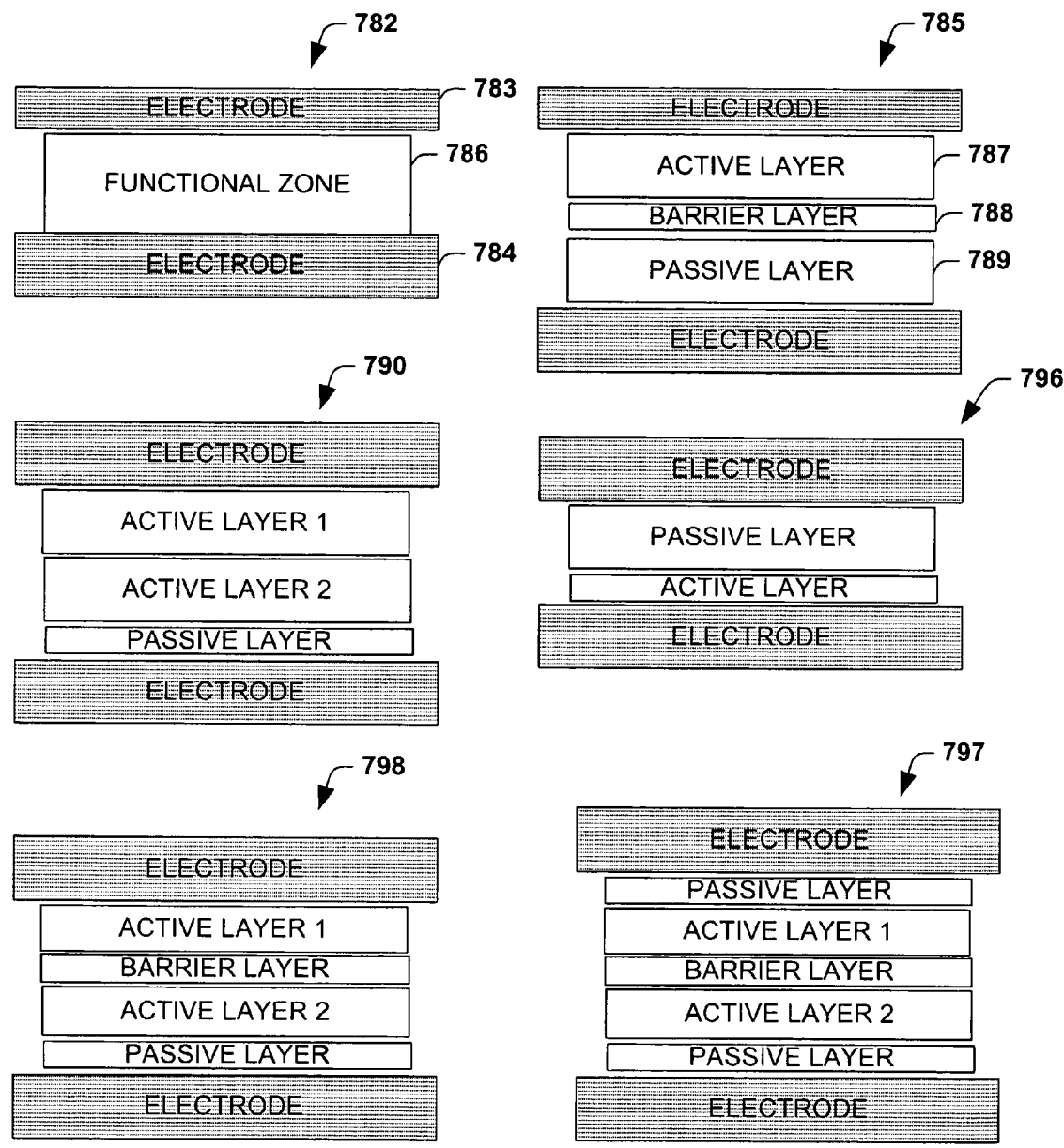

Referring now to FIGS. 7a and 7b structures of memory cells with various exemplary electrode arrangements and material are illustrated. Typically for such memory cells, upper and lower electrodes sandwich various other active, passive, functional zone, and polymer layers, which can also include various light emitting material, such as; light emitting structure, photo resistance, or photo sensors. The electrodes (e.g. 704, 710) can be comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 0.01 μm or more and about 10 μm or less, about 0.05 μm or more and about 5 μm or less, and/or about 0.1 μm or more and about 1 μm or less. The electrodes can be placed in an alternating fashion among various layers of for example semiconductor layers, polymer layers, and passive layers.

The active layer 708 and the passive layer 706 of FIG. 7a are collectively referred to as a selectively conductive media or selectively conductive layer. As explained supra, the conductive properties of this media (e.g., conductive, non-conductive, semi-conductive) can be modified in a controlled manner by applying various voltages across the media via the electrodes 704 and 710. The active layer 708 can be comprised of a conjugated material 750, such as a small organic molecule and a conjugated polymer. If the organic layer is polymer, a polymer backbone of the conjugated organic polymer may extend lengthwise between the electrodes 704 and 710 (e.g., generally substantially perpendicular to the inner, facing surfaces of the electrodes 704 and 710). The conjugated organic molecule can be linear or branched such that the backbone retains its conjugated nature. Such conjugated molecules are characterized in that they have overlapping $7r$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant. The organic layer 750 has a suitable thickness that depends upon the chosen implementations and/or the memory device being fabricated. Some suitable exemplary ranges of thickness for the organic polymer layer 750 are about 0.001 μm or more and about 5 μm or less, about 0.01 μm or more and about 2.5 μm or less, and about a thickness of about 0.05 μm or more and about 1 μm or less.

The organic layer 750 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 706.

The passive layer 706 of FIG. 7a contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 750. The particular conductivity facilitating compound employed is selected so that the two relatively stable states match with the two relatively stable states of the conjugated organic molecule of layer 750.

The passive layer 706 is operative to transport charge from the first electrode 704 to the interface between the organic layer 750 and the passive layer 706. Additionally, the passive layer 706 facilitates charge carrier (e.g., electrons or holes) injection into the organic layer 750 and increases the concentration of the charge carrier in the organic layer resulting in a modification of the conductivity of the organic layer 750. Furthermore, the passive layer 706 can also store opposite charges in the passive layer 706 in order to balance the total charge of the device. In addition, the passive layer 706 can in some instances act as a catalyst when forming the organic layer 750. In this connection, the backbone of the conjugated organic molecule may initially form adjacent the passive layer 706, and grow or assemble away and substantially perpendicular to the passive layer surface. As a result, the backbones of the conjugated organic molecule may be self aligned in a direction that traverses the two electrodes.

Examples of conductivity facilitating compounds that may make up the passive layer 706 include, but are not limited to, one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 706 may be grown using oxidation techniques, formed via gas phase reactions, or deposited between the electrodes. It is to be appreciated that the invention is not so limited and other conducting and/or semi conducting materials can also be employed. In addition, other layer structures such as active layers, barrier layers, functioning zones can be employed in fabricating the memory cell. The passive layer 706 has a suitable thickness that can vary based on the implementation and/or memory device being fabricated. Some examples of suitable thicknesses for the passive layer 706 are as follows: a thickness of about 2 Å or more and about 0.1 μm or less, a thickness of about 10 Å or more and about 0.01 μm or less, and a thickness of about 50 Å or more and about 0.005 μm or less.

In order to facilitate operation of the organic memory device, the organic layer 750 is generally thicker than the passive layer 706. In one aspect, the thickness of the organic layer is from about 0.1 to about 500 times greater than the thickness of the passive layer. It is appreciated that other suitable ratios can be employed in accordance with the present invention.

As illustrated in FIG. 7a, various other electro conductive and optically transparent materials can also be employed, e.g. when formation of elements such as; diodes, and photo sensors, photo diodes, photo resistance, or light emitting structures are desired. For example, light emitting layer 720 (e.g. comprising polyphenil vinylene) and light sensing layer 740 are separated by transparent electrode 725 (e.g. comprising indium oxide.) Such structure can facilitate an optical programming (e.g. writing and/or erasing) of the organic memory cell. For example, the light emitting layer 720 if subjected to a voltage can generate light as a function of the impedance state of the organic memory cell. Such emitted light can then be received by the light sensing material 740, and depending on received light properties (e.g. amount, intensity, polarity, phase and the like), various states can be programmed in the memory cell. Typically, a memory structure employing a plurality of electrodes and passive/active layers facilitates decoupling of the of Read/Write circuits, e.g. a diode structure, photo resistance, photo sensor elements and the like. At the same time, various diode components can be formed (e.g. via employing additional layers of electrodes, conductive/semi conductive material) as part of the memory cell structure.

In addition, active layers 708, which in conjunction with the passive layer constitute a functional zone for the memory cell, can also be employed. Such active layers can include various semiconductors, ceramics, organic polymers and typically materials that can demonstrate substantial impedance variations, when in contact with charged particles. It is to be appreciated that various structural forms for the memory cell such as; multi-numbered partial top electrodes and bottom electrodes can also be employed, and are within the realm of the present invention. Such structures can facilitate isolation and decoupling of the various Read/Write circuits, and improve accuracy when programming a memory cell. Memory density can also be increased with such structures.

During typical memory cell operation, electrons can flow between electrodes 710 and 704 through the selectively conductive media, and/or the functional zone based on a voltage state applied to the electrodes. For example, holes can flow from the first electrode 704 to second electrode 710 if the organic layer 750 is p-type conductor, or both electrons and holes flow in the organic layer if it can be both n and p type with proper energy band match with 706 and 710. As such, current flows from the first electrode 704 to the second electrode 710 via the selectively conductive media.

FIG. 7b illustrates various layers incorporated as part of the structures of memory cells with two electrodes, according to exemplary aspects of the present invention. The memory cell 782 has a three layered structure, which consists of two electrodes 783, 784 and a functional zone 786 sandwiched there between. In one exemplary aspect of the present invention, and as depicted by the memory cell structure 785, such a functional zone 786, can further include various alternating active, barrier and passive layers; such as 787, 788, 789 respectively. The barrier layer 788 can be comprised of material such as $Li_3N$ deposited via a CVD process to an exemplary thickness of approximately 50 Å. Furthermore, each layer can comprise further sub layers, as illustrated by the memory cell structure 790, wherein the active layer itself comprises an active layer 1 and active layer 2. It is to be appreciated that other arrangements for stacking the active, passive, and barrier layers (e.g. 796, 797, and 798) are possible, and are within the realm of the present invention.

The discussion infra describes and illustrates charge carrier concentration and models behavior of organic memory devices.

In the following example, conductive polymer is used as organic material, and CuS is used as passive layer material. With respect to charge carrier generation, the copper in CuS is at its highest oxidation state Cu(II). It has relatively strong capability to gain electrons from a contacting polymer and yields the following equation:

$$Cu(II)S + Polymer \rightarrow Cu(I)S^- + Polymer^+ \quad (1)$$

Figure 8:
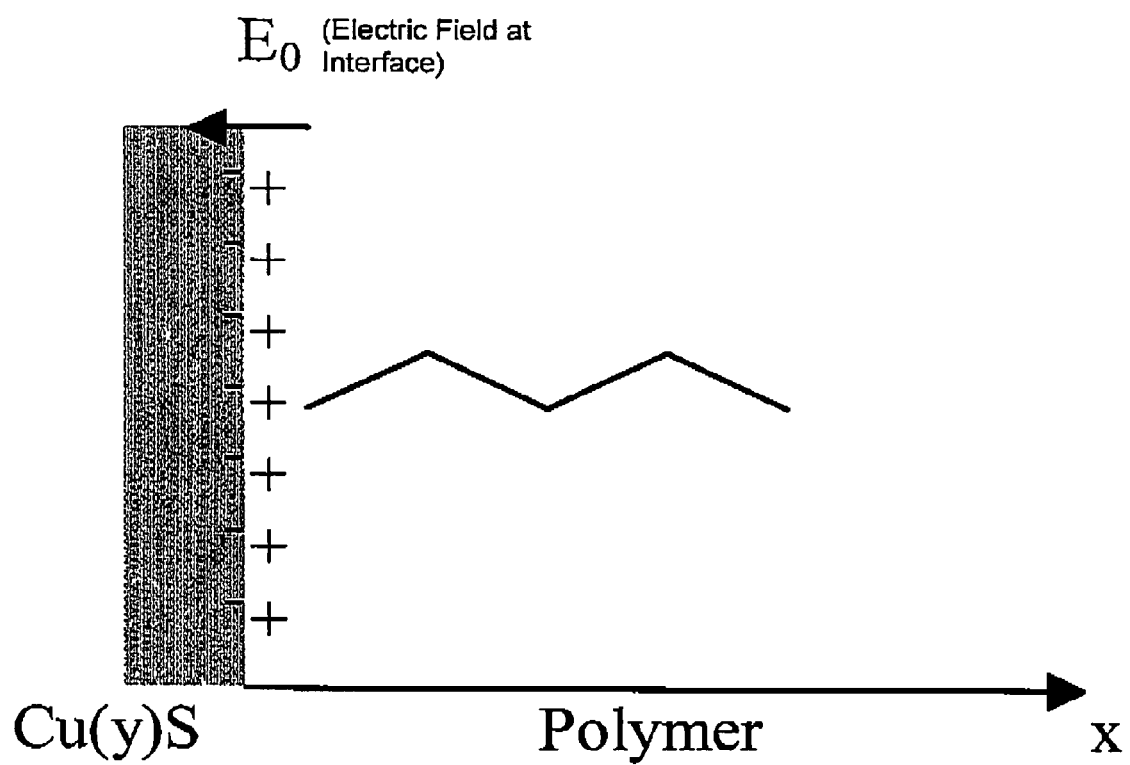
FIG. 8 is a graph depicting the effect of an intrinsic electric field on an interface between a passive layer and a polymer layer in accordance with an aspect of the present invention.

The consequence is that an intrinsic field is produced due to the charges accumulated on the interface between CuS and polymer. This is shown in FIG. 8, which is a graph depicting the effect of an intrinsic electric field on an interface between Cu(y)S (with y accepting a suitable value e.g. from 1 to 2) and a polymer is provided. The oxidized polymer (Polymer$^+$) is the charge carrier when external field is applied. The conductivity of polymer is determined by its concentration and its mobility.

$$\sigma = qp\mu \quad (2)$$

Where q is the charge of the carrier, p is carrier concentration and μ is the mobility.

Referring now to the charge depletion layer, employing a similar concept as applied with respect to semiconductors, a potential function can be expressed as:

$$V(x) = qN_p(d_p x - x^2/2)/\epsilon \quad (3)$$

where $N_p$ is the average concentration of charge carrier, $\epsilon$ is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \quad (4)$$

where V is the external field voltage applied. For forward voltage, it is "−" sign. For the reverse voltage, it is "+" sign.

The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu p E \quad (5)$$

where D is diffusion constant of the charge carrier, and E is the electric field at x. If there is no current, the carrier distribution is:

$$p(x) = p(0)\exp([(V(0) - V(x))/V t]) \quad (6)$$

where p(0) is the concentration, V(0) is voltage at the interface respectively, and $V_t = kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x) > V_0$, the charge concentration is a decrease function of x.

The final characteristic, retention time, refers to the fact that a forward voltage produces more charge carrier and the charge carrier accumulates more on the other end of the passive (CuS) layer (away from the organic polymer). However, this charge carrier concentration will be set back once the voltage is removed, which includes two processes: charge carrier diffusion toward the CuS layer and charge carrier recombination on the interface. Fick's Law can describe the 1st process, charge carrier diffusion toward the CuS layer. The charge carrier recombination can be described as follows:

$$Cu(I)S^- + Polymer^+ \rightarrow Cu(II)S + Polymer \quad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1-9 discussed supra and illustrated in FIGS. 9-14. The exemplary cell is considered with parameters intrinsic voltage $V_b = 0.02V$, equilibrium constant $K_{eq} = 2.17 \times 10^{-4}$, concentration of CuS and Polymer at interface $[Polymer]_0 = [CuS]_0 = 10^{23}/cm^3$, polymer thickness $d = 5 \times 10^{-5}$ cm (0.5 um), and CuS thickness $d_{CuS} = 5 \times 10^{-7}$ cm (0.005 um). Six typical cases are calculated to illustrate electrical operation of an organic memory device in accordance with an aspect of the present invention.

Figure 9:
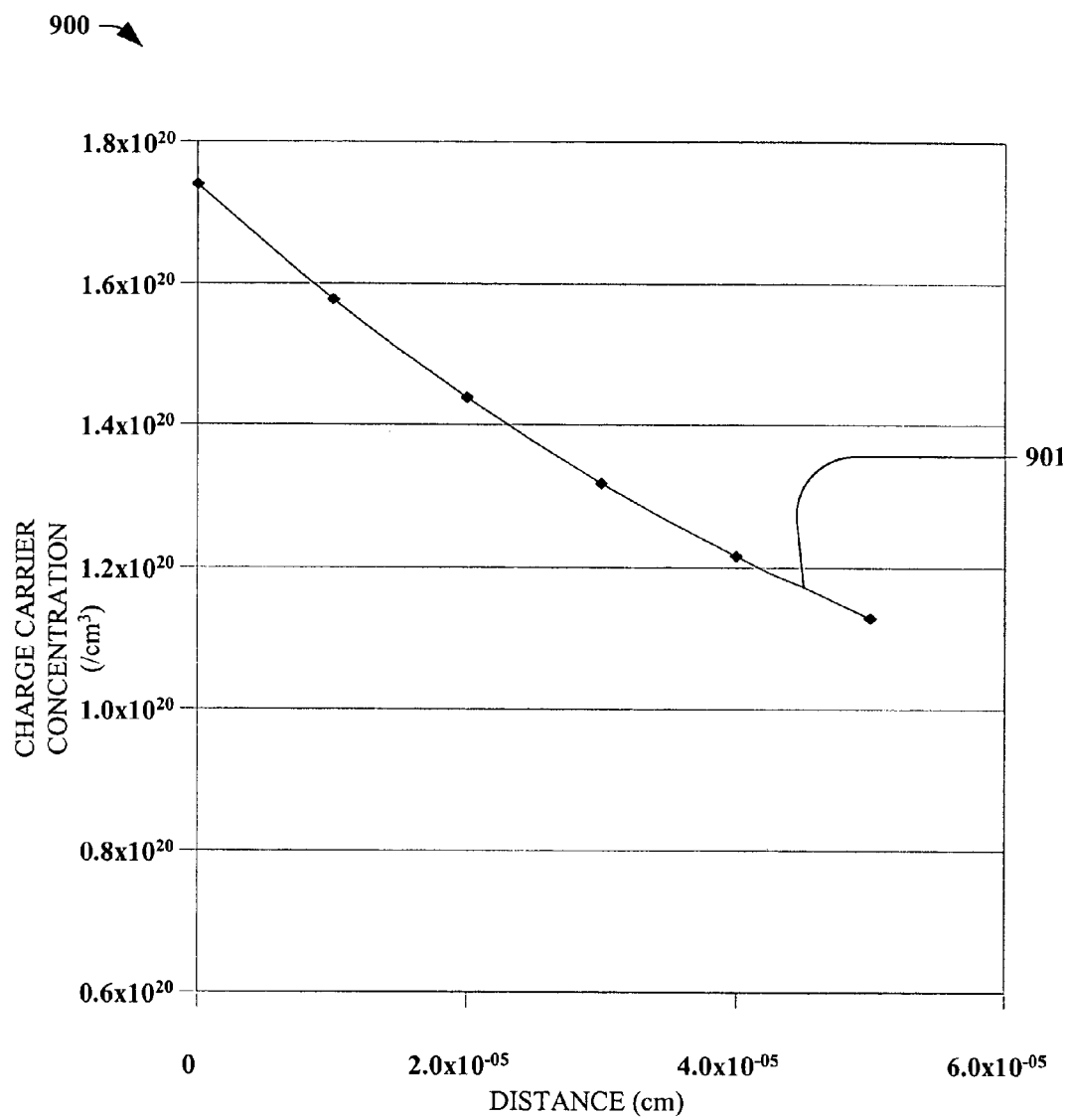
FIG. 9 is a graph illustrating charge carrier distribution of an exemplary memory cell in accordance with an aspect of the present invention.

FIG. 9 depicts a graph 900 of charge carrier distribution 901 of the exemplary memory cell as a function of distance from the CuS and organic polymer interface in accordance with an aspect of the invention. The charge carrier concentration 901 is shown as being a decreasing function of distance (x) from the interface. This graph 900 assumes an external voltage V=0 and a current J=0. The charge carrier concentration 901 is derived utilizing Eq. 6 with a constant field assumption. However, the points shown are independent of the constant field assumption.

Figure 10:
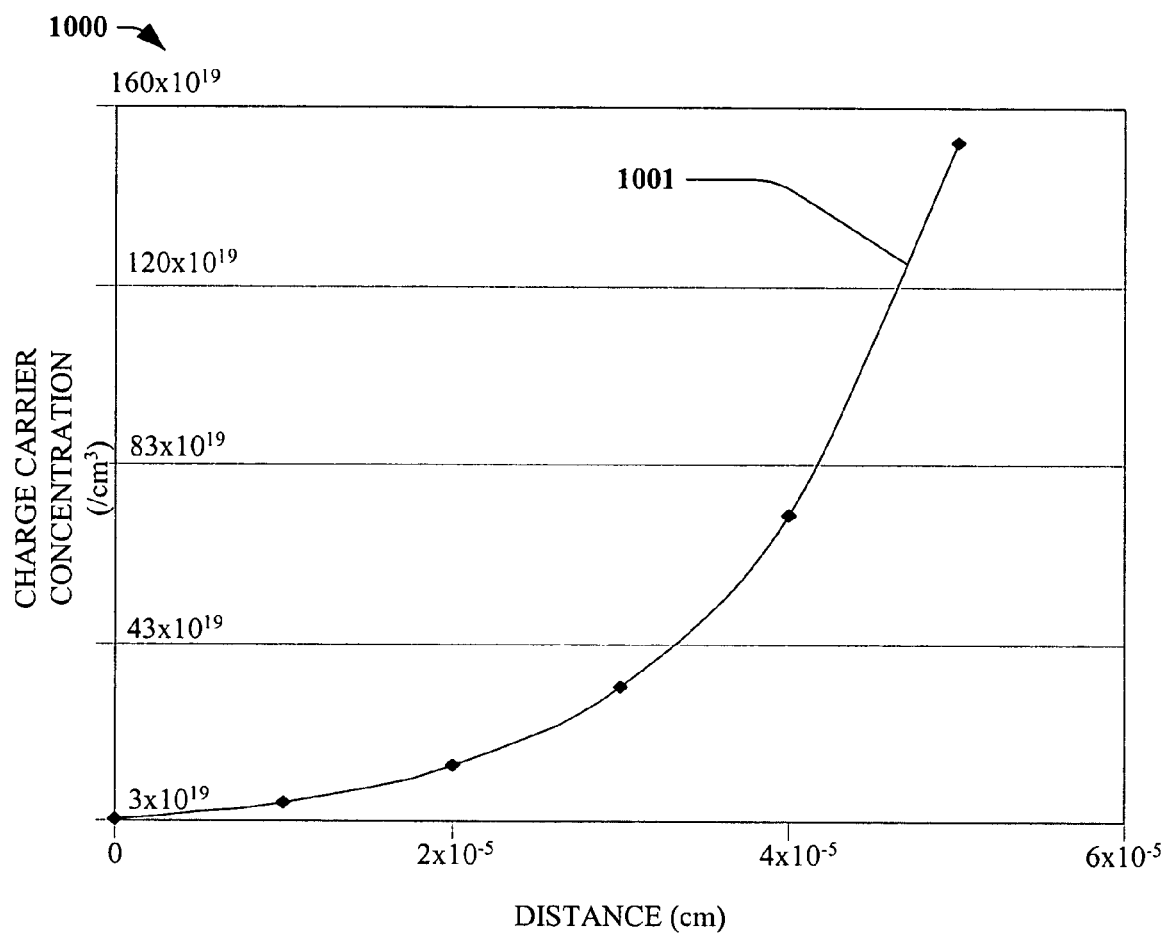
FIG. 10 is a graph illustrating charge carrier distribution of an exemplary memory cell in accordance with an aspect of the present invention.

Turning now to FIG. 10, another graph 1000 illustrating charge carrier distribution 1001 for the exemplary organic memory cell is depicted in accordance with an aspect of the present invention. For this graph 1000, parameters are set as follows: forward voltage=0.12V and current flux J=0. The CuS end has a higher voltage than the other end (organic polymer). This drives the charge carrier away from CuS layer and leads to charge carrier concentration that has an increase function of x. Even at lowest concentration p(0), it is not a small value for this case. This explains why the polymer is a good conductor when forward voltage is applied. Again, it is Eq. 6 with constant electric field model used for the plot. The points demonstrated are independent of constant electric field assumption.

Figure 11:
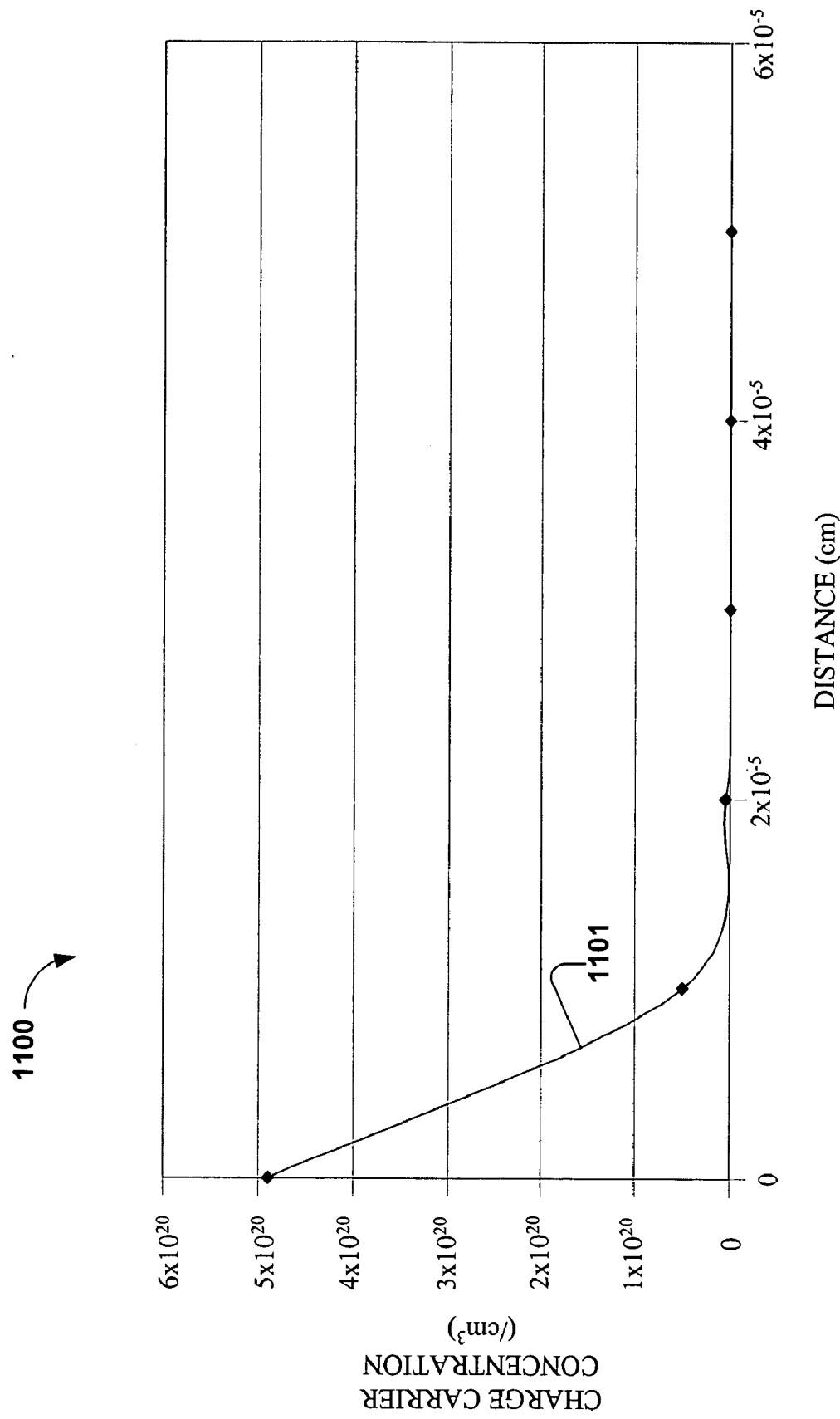
FIG. 11 is a graph illustrating charge carrier distribution of an exemplary memory cell in accordance with an aspect of the present invention.

FIG. 11 depicts yet another graph 1100 of charge carrier distribution 1101 of the exemplary memory cell as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the organic memory cell becomes non-conductive when high reversed voltage applied. Again, Eq. 6 with constant electric field model is assumed for the plot. The points demonstrated are independent of this assumption.

Figure 12:
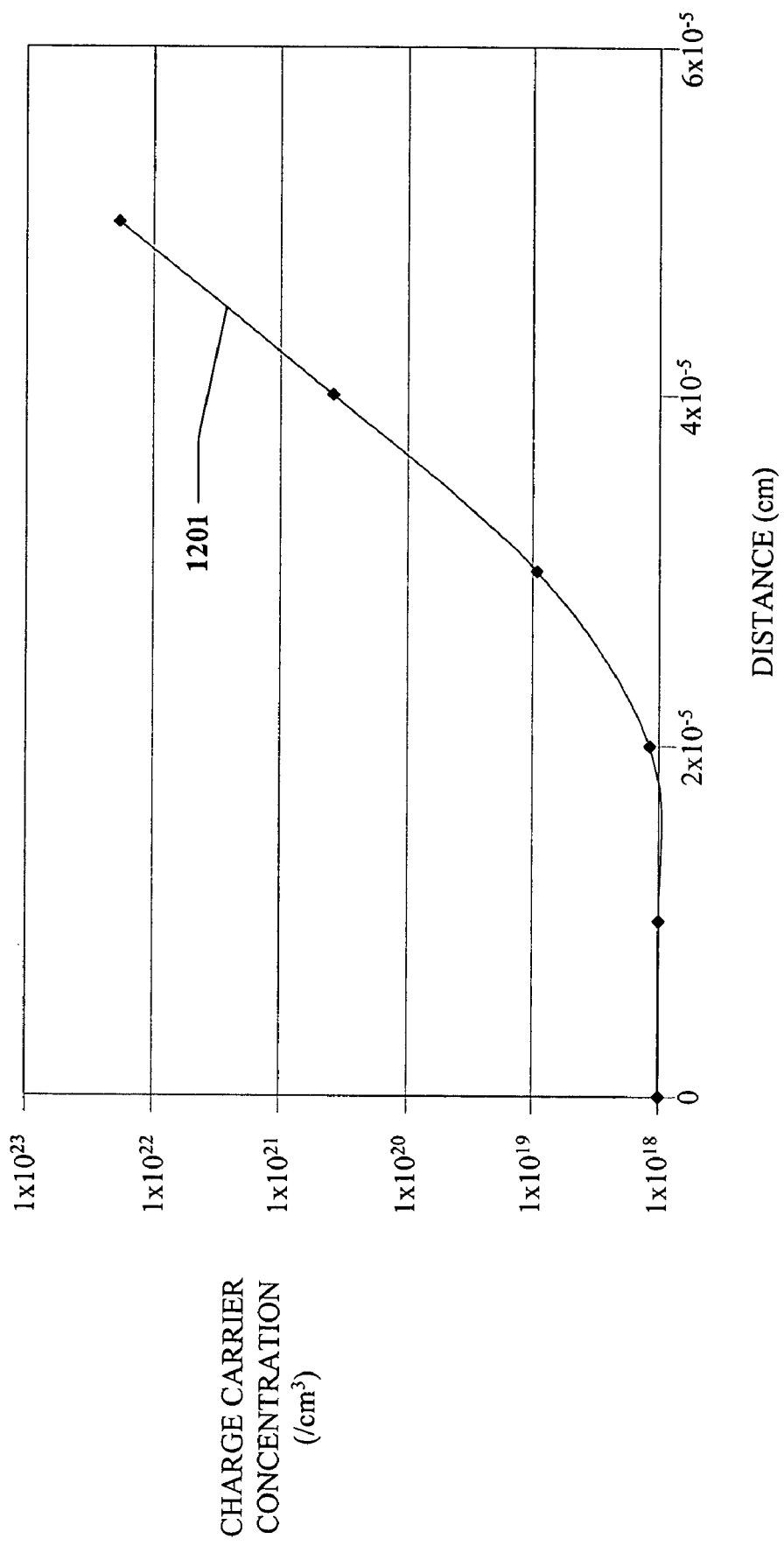
FIG. 12 is a graph illustrating charge carrier distribution of an exemplary memory cell in accordance with an aspect of the present invention.

Referring now to FIG. 12, another graph 1200 that depicts charge carrier distribution 1201 of the exemplary memory cell as a function of distance in accordance with an aspect of the present invention is provided. For this graph 1200, parameters are set as follows: forward voltage=0.52V and current flux J>0 ($p_j=10^{18}$/cm$^3$). When current flux J>0, the charge carrier is still an increase function of x because the forward voltage drives the charge carrier away from CuS interface. One important point is that the lowest concentration p(x) is at interface.

Figure 13:
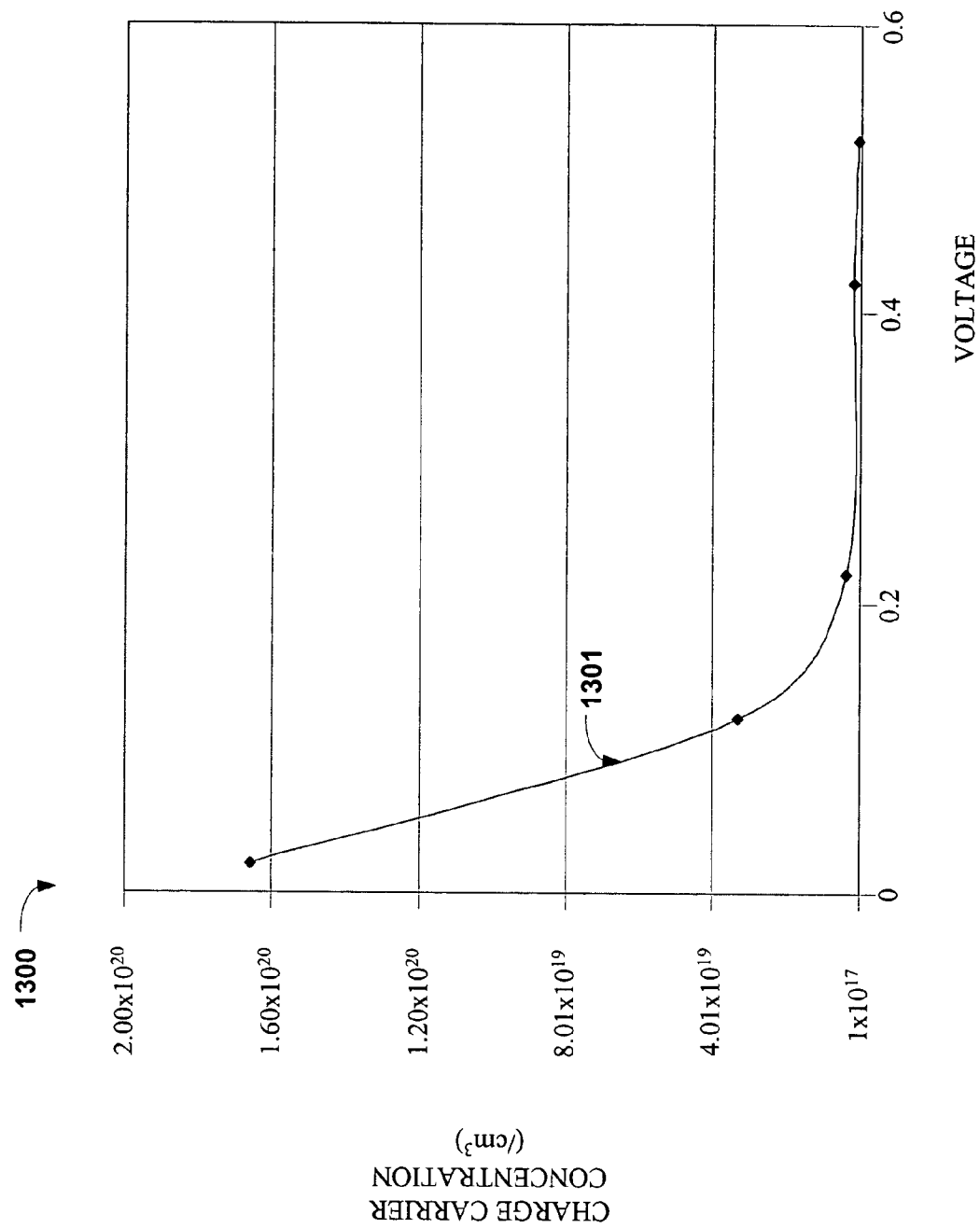
FIG. 13 is a graph illustrating charge carrier concentration at the interface of an exemplary memory cell in accordance with an aspect of the present invention.

FIG. 13 depicts yet another graph 1300 of charge carrier concentration at interface 1301 of the exemplary memory cell as function of forward voltage V. For this graph, the parameters are set such that J>0 ($p_j=10^{18}$/cm$^3$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[CuS]_0}{d}}\right\} \quad (10)$$

This Eq. 10 shows that limiting p(0) is an increase function of thickness ratio between CuS layer and polymer layer.

Figure 14:
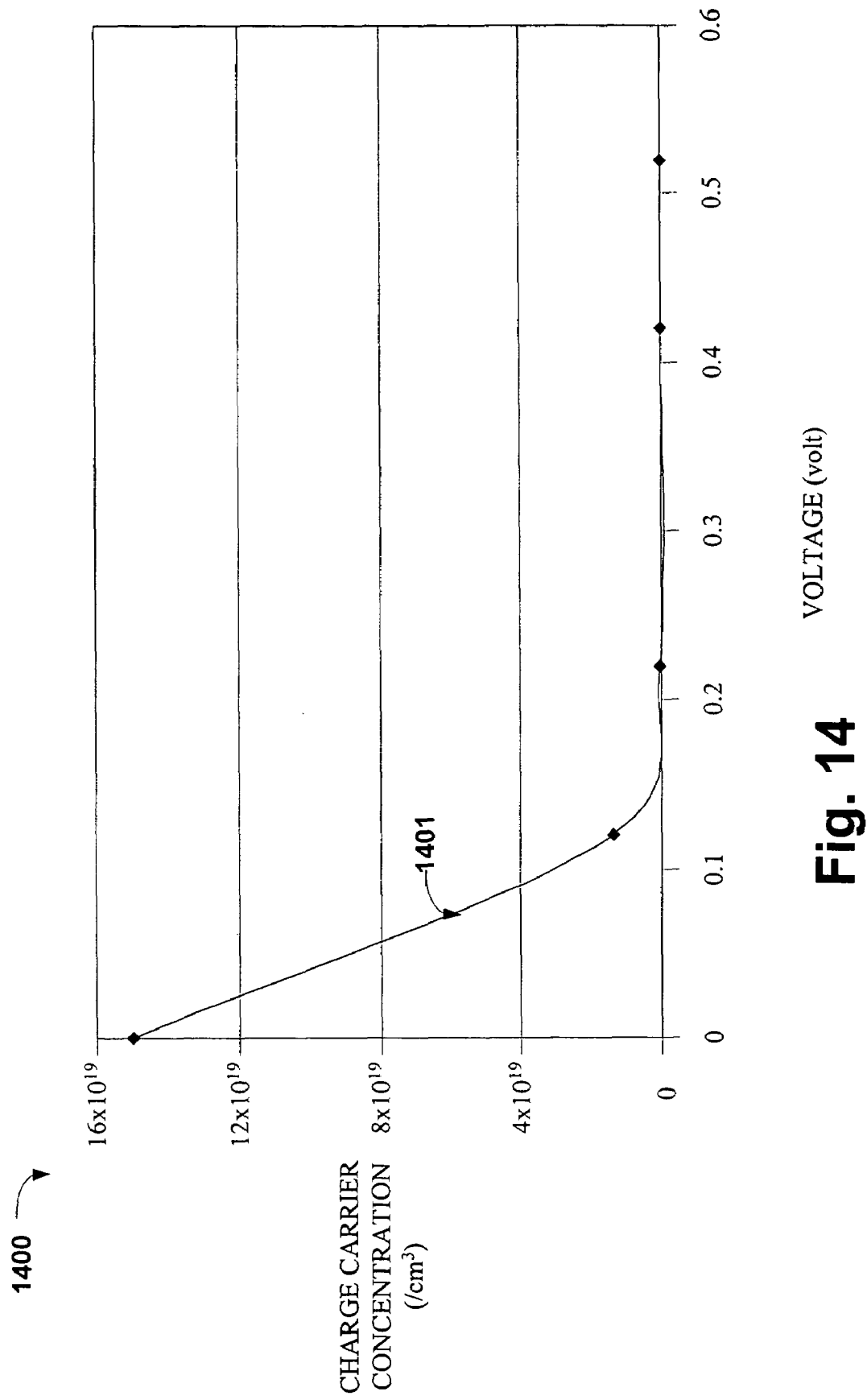
FIG. 14 is a graph illustrating charge carrier concentration at the interface of an exemplary memory cell in accordance with an aspect of the present invention.

FIG. 14 illustrates another graph 1400 that depicts charge carrier concentration at the interface 1401 of the exemplary memory cell as function of forward voltage V in accordance with an aspect of the present invention is provided. For this graph 1400, p(0) is a function of forward voltage, current J, which may or may not be >0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 14 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[CuS]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is p(x). $p_j=p(0)$ is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(x) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (e.q. 1-7) and the FIGS. 11-14 describe and model behavior of organic memory devices. This model can be employed to explain measured data and can be for other passive layer materials aside from CuS. Additionally, the model can be used to think about how to improve retention and response time and to design the other devices such as transistor. Further, the model can be employed to develop various threshold voltages that set conductivity levels (e.g., set states), read conductivity levels and erase the conductivity levels thus performing memory device operations of writing or programming, reading and erasing.

Figure 15:
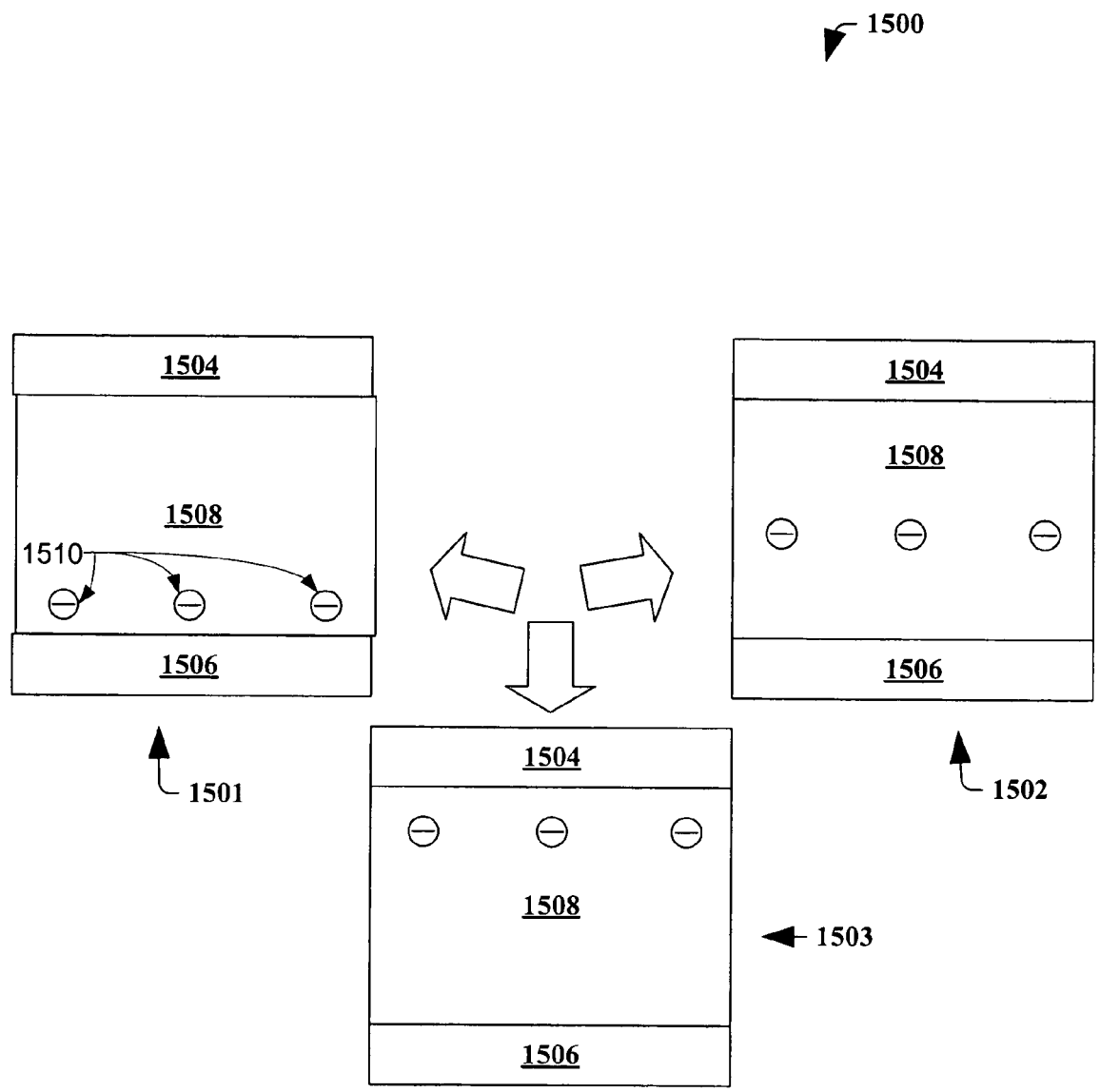
FIG. 15 is a schematic diagram depicting an organic memory device in various states in accordance with an aspect of the present invention.

FIG. 15 is a schematic diagram that illustrates an organic memory device 1500 in various states in accordance with an aspect of the present invention. The device 1500 is depicted in a first "off" state 1501, an "on" state 1502, and a second "off" state 1503. It is appreciated that memory devices formed in accordance with the present invention can have other states than those depicted in FIG. 15. The organic memory device 1500 comprises a top electrode 1504, a bottom electrode 1506 and a selectively conductive layer 1508 comprising an organic layer (e.g., PPA) and at least one passive layer (e.g., CuS).

In the first off state 1501, electrons 1510 collect in the selectively conductive layer 1508 near the bottom electrode 1506. In the on state 1502, the electrons 1510 are uniformly distributed thereby indicating an on state. In the second off state 1503, the electrons collect in the selectively conductive layer 1508 near the top electrode 1504.

Figure 16:
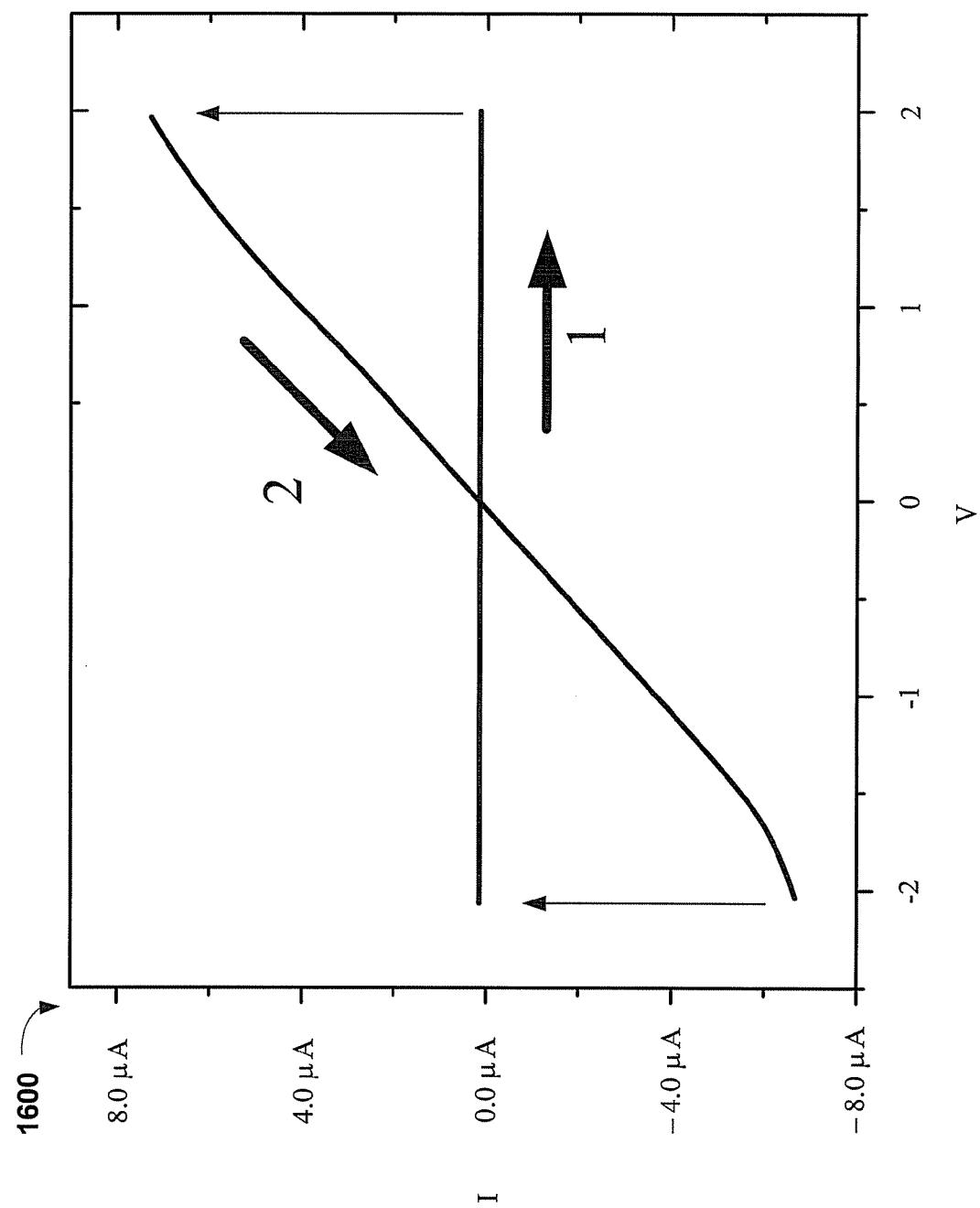
FIG. 16 is a graph illustrating I-V characteristics for an organic memory device in accordance with an aspect of the present invention.

FIG. 16 is a graph 1600 that illustrates I-V characteristics for an organic memory device of the present invention. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1500 can be modified to change from state 2 to state 1 by application of a negative voltage, therein causing a reverse current until the state 1 is obtained.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. A system that programs a memory cell comprising:
    a memory cell to be programmed comprising;
        a first electrode that forms a base for the memory cell;
        a functional layer formed over the first electrode to facilitate charge migration in the memory cell, an impedance state(s) of the functional layer changes based on a migration of electrons or holes when subject to an external electric field or light radiation, the impedance state(s) indicative of more than two programming states of the memory cell; and
        a second electrode formed over the functional layer and operative with the first electrode to activate a memory portion in the memory cell,
    a control component that applies an external stimulus to the memory cell, to affect at least one of an electrical and optical property associated with the memory cell, the control component comprising a comparator that compares a value of the at least one of an electrical and optical property with a threshold value, to determine a program state of the memory cell;
    a ballast resistor operatively connected to the memory cell; and
    a registering device for monitoring circuit conditions during programming of the memory cell.

2. The system of claim 1, the control component comprising a generator.

3. The system of claim 1, wherein the external stimulus is a voltage.

4. The system of claim 1, wherein the impedance of the memory cell represents four bits of information.

5. The system of claim 1, the functional layer is a selectively conductive media further comprising an organic light emitting material.

6. The system of claim 1, the functional layer comprises a passive layer, an active layer and a barrier layer.

7. The system of claim 1, the second electrode comprising a plurality of electrodes to facilitate decoupling of write and read circuits that program the memory cell.

8. The system of claim 1 further comprising a second registering device.

9. The system of claim 1, wherein the registering device comprises a voltmeter.

10. The system of claim 1, wherein the registering device comprises a oscillograph.

11. A method of programming a memory cell using the system of claim 1, comprising:
    providing a memory cell comprising a selectively conductive layer that is sandwiched between electrodes;
    applying an external stimulus to the memory cell to affect an impedance state of the memory cell and indicate one state of more than two impedance states of the memory cell; and
    comparing the impedance state with a predetermined threshold value.

12. The method of claim 11, wherein applying an external stimulus comprises applying a voltage to the memory cell.

13. The method of claim 11, further comprising comparing an electric current passing through the memory cell with a predetermined threshold value.

14. The method of claim 11, further comprising removing the external stimulus based on an outcome of the comparing act.

15. A method of programming information in a memory cell using the system of claim 1, comprising:
    applying an electric field pulse that exceeds a threshold value to the memory cell, the memory cell comprising a selectively conductive layer that is sandwiched between electrodes; and
    controlling at least one of an impedance of the cell, current flowing through the cell, and a time duration that current flows through the cell, to program the memory cell, to one of more than two operating states of the memory cell.

16. The method of claim 15 further comprising comparing a current flowing through the cell with a predetermined value.

17. The method of claim 16 further comprising removing the electric field pulse based on an outcome of comparing a current flowing through the cell with a predetermined value.

18. The method of claim 17 further comprising applying a further electric pulse to read information from the memory cell.

19. The method of claim 15 further comprising applying a reverse electric field pulse to erase programmed information.

* * * * *